(12) United States Patent
Ito

(10) Patent No.: US 8,180,473 B2
(45) Date of Patent: May 15, 2012

(54) EXPOSURE SYSTEM, METHOD OF TESTING EXPOSURE APPARATUS, AND METHOD OF MANUFACTURING DEVICE

(75) Inventor: Takashi Ito, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 267 days.

(21) Appl. No.: 12/729,541

(22) Filed: Mar. 23, 2010

(65) Prior Publication Data

US 2010/0249980 A1    Sep. 30, 2010

(30) Foreign Application Priority Data

Mar. 25, 2009    (JP) ................................. 2009-075142

(51) Int. Cl.
*G06F 19/00*    (2011.01)
(52) U.S. Cl. ........................... 700/121; 700/87; 717/168
(58) Field of Classification Search .................... 700/87, 700/121; 717/168
See application file for complete search history.

(56) References Cited

U.S. PATENT DOCUMENTS

| | | | | |
|---|---|---|---|---|
| 6,973,636 B2 * | 12/2005 | Shin et al. | .................. | 716/51 |
| 7,642,100 B2 * | 1/2010 | Yu et al. | ...................... | 438/14 |
| 8,112,165 B2 * | 2/2012 | Meyer et al. | .................... | 700/87 |
| 2002/0024644 A1 * | 2/2002 | Ina et al. | .......................... | 355/53 |
| 2002/0024646 A1 * | 2/2002 | Hiura | .............................. | 355/53 |
| 2002/0046140 A1 * | 4/2002 | Kano et al. | ...................... | 705/27 |
| 2003/0197849 A1 * | 10/2003 | Ishikawa et al. | ............... | 355/69 |
| 2009/0002667 A1 * | 1/2009 | Sekine | ............................ | 355/67 |

FOREIGN PATENT DOCUMENTS

| | | |
|---|---|---|
| JP | 11-186118 A | 7/1999 |
| JP | 11-296352 A | 10/1999 |

* cited by examiner

*Primary Examiner* — Michael D Masinick

(74) *Attorney, Agent, or Firm* — Rossi, Kimms & McDowell LLP

(57) ABSTRACT

An exposure system is configured to update control software installed on an exposure apparatus to new control software. The exposure system comprises: at least one exposure apparatus; a simulator configured to test an operation of the exposure apparatus; an output unit configured to output configuration information of the exposure apparatus, which includes information representing a temporal change of the exposure apparatus; a reflecting unit configured to reflect the temporal change of the exposure apparatus on the simulator based on the configuration information output from the output unit; and an updating unit configured to update control software installed on the simulator to new control software.

8 Claims, 5 Drawing Sheets

EXPOSURE SYSTEM, METHOD OF TESTING EXPOSURE APPARATUS, AND METHOD OF MANUFACTURING DEVICE

BACKGROUND OF THE INVENTION

1. Field of the Invention

The present invention relates to an exposure system, a method of testing an exposure apparatus, and a method of manufacturing a device.

2. Description of the Related Art

In recent years, to keep up with advances in micropatterning and an increase in packing density of semiconductor integrated circuits such as an IC and an LSI and liquid crystal display panels, exposure apparatuses for manufacturing such products have become more accurate and sophisticated. Exposure apparatuses called a stepper and scanner are commonly used in the process of manufacturing such products. These exposure apparatuses sequentially transfer a pattern formed on an original (e.g., a reticle) to a plurality of portions on a substrate (e.g., a wafer) while moving the substrate in steps. An apparatus that performs this transfer by full-field exposure is called a stepper, whereas one that performs this transfer while scanning stages is called a scanner. An exposure apparatus including two substrate stages which hold substrates has recently been put into practical use to meet two demands for improvements in both the overlay accuracy and throughput which are of prime importance for exposure apparatuses. In addition, the development of an exposure apparatus which attains high-resolution transfer by filling the space between a substrate and a projection optical system which projects an image of an original with a liquid has also progressed.

Amid such improvements in accuracy and performance of exposure apparatuses, control software for controlling an exposure apparatus is upgraded as needed so that it becomes more accurate and sophisticated as well. Such control software upgrading is often applicable not only to an exposure apparatus to be newly developed but also to an exposure apparatus that has already been put into operation. Control software version upgrading for updating the control software installed on an active exposure apparatus to new control software is frequently performed.

Conventional control software version upgrading in an exposure apparatus will be described next. FIG. 7 is a schematic block diagram showing an exposure system that updates the control software installed on an exposure apparatus to new control software. A semiconductor device manufacturing plant 1 as one example of the installation location of an exposure apparatus is equipped with an exposure apparatus 11 and an updating unit 15 that updates control software. The exposure apparatus 11 includes an exposure unit 12 which exposes a substrate via the pattern of an original, a controller 13 which controls an exposure apparatus, and a data holding unit 14 which holds control software used to control the exposure apparatus. The updating unit 15 is connected to one or more exposure apparatuses 11 and updates the control software on the exposure apparatus 11 to new control software.

FIG. 8 illustrates one example of the procedure for updating the control software on an exposure apparatus. In step S801, the updating unit 15 inspects the hardware configuration and necessary functions of an exposure apparatus having its control software to be updated, and determines the version of control software to be adopted. In step S802, the operator prepares a medium that stores new control software necessary for updating, and copies it into the updating unit 15. More specifically, the operator inserts a medium such as a magnetooptical disk that stores new control software into the updating unit 15, and copies the new control software and its associated data such as an installer into the updating unit 15. After executing steps S801 and S802 in advance, the operator stops the exposure process of the exposure apparatus 11 in step S803.

In step S804, the updating unit 15 updates the control software on the exposure apparatus. More specifically, using data containing the control software stored in step S802, the updating unit 15 updates the control software stored in the data holding unit 14 of the exposure apparatus 11. By restarting the controller 13 and exposure unit 12 of the exposure apparatus 11 after the control software is updated, the updated software is reflected on the exposure apparatus 11. Lastly, in step S805, the exposure apparatus 11 after its control software is updated is tested. If no problem is found in the test in step S805, the exposure apparatus 11 starts an exposure process in step S806. Note that in step S805, the exposure apparatus 11 performs, for example, test exposure in order to confirm that the control software has been updated correctly.

Japanese Patent Laid-Open No. 11-296352 discloses an example of such updating of the control software on an exposure apparatus. In this example, the control software on an exposure apparatus is updated by confirming the remaining memory capacity of an external storage device which stores, for example, control software. Updating the control software on an exposure apparatus makes it possible to improve the accuracy and performance of even an active exposure apparatus, and this is effective in improving the productivity of the exposure apparatus.

In the development of control software for an exposure apparatus, control software tests are frequently conducted every time a new version is created to keep up with frequent version upgrading. To conduct these control software tests, it is a common practice to confirm the operation of the control software by an exposure apparatus. In contrast, Japanese Patent Laid-Open No. 11-186118 proposes a method of confirming the operation of the control software using a device (to be referred to as a simulator hereinafter) that simulates the operation of an exposure apparatus. The use of a simulator allows an efficient test operation and prevention of any damage inflicted on the exposure apparatus by the control software during the test.

As has been described above, to improve the productivity of an active exposure apparatus, it is effective to improve the accuracy and performance of the exposure apparatus by control software updating.

As has been described in "Description of the Related Art", control software for controlling an exposure apparatus has become more sophisticated. In response to this trend, the function of the control software has become more complex. An exposure apparatus has a multiple of options, so a multiple of functions are imparted to control software especially for an exposure apparatus in correspondence with these options. An exposure apparatus has, for example, an option for selecting exposure light in accordance with the user's purposes, and an option for selecting the position to load a substrate into the apparatus in accordance with the installation location of the apparatus, and functions corresponding to these options are imparted to control software for an exposure apparatus. Also, control software itself has an option for speeding up the processing involved by optimizing the control method adopted in accordance with the user's application. Control software becomes larger with its increasing complexity, so it is a mainstream practice to control an exposure apparatus by a combination of a plurality of software programs. Under the circumstance, the number of necessary software programs increases as well.

Control software for an exposure apparatus is generally developed and tested by a vendor as the developer of the exposure apparatus. As described above, as control software becomes more complex and larger, both the cost of development of control software and that (e.g., the test time) of a test of the control software rise. Especially various types of hardware and software options and test items as a combination of various types of increasing functions and various types of software for controlling an exposure apparatus reach huge numbers, and this raises the test cost of control software. To combat this situation, it is possible to improve the efficiency of a test of control software by exploiting the method that uses a simulator, described in "Description of the Related Art", but a demand has arisen for a method of further improving the efficiency of a test.

Since an exposure apparatus is a production facility, it is generally used without interruption all day. Hence, the downtime as the time for which an exposure apparatus is used for purposes other than an exposure process, such as maintenance, adversely affects the user productivity. Although control software updating is effective in improving the productivity in the long run, the exposure apparatus must be stopped during the control software updating, and this temporarily lowers the productivity. If a test of control software to be updated is unsatisfactory, updating may fail or the updated control software may damage the exposure apparatus. When this occurs, an operation such as returning of the control software version to old one must be performed, and this more largely lowers the user productivity.

Since an exposure apparatus is a manufacturing apparatus, it has an aspect of being used only to manufacture specific products. Also, manufacturing plants which use exposure apparatuses are generally large-scale, and the number of them is naturally limited. Due to these facts, exposure apparatuses are used at limited locations by limited methods in practice as compared with general products. That is, an exposure apparatus has enormous amounts of combinations of options and functions but the combinations used in practice are limited to specific ones.

The optical performance and other performances of a projection optical system of an exposure apparatus temporally change, so even individual exposure apparatuses of the same model have differences in state. When the control software on an exposure apparatus is updated with no concern for the state of the exposure apparatus attributed to this temporal change, updating may fail or the updated control software may damage the exposure apparatus.

SUMMARY OF THE INVENTION

The present invention safely, reliably updates the control software on an exposure apparatus.

According to the present invention, there is provided an exposure system configured to update control software installed on an exposure apparatus to new control software, the system comprising: at least one exposure apparatus; a simulator configured to test an operation of the exposure apparatus; an output unit configured to output configuration information of the exposure apparatus, which includes information representing a temporal change of the exposure apparatus; a reflecting unit configured to reflect the temporal change of the exposure apparatus on the simulator based on the configuration information output from the output unit; and an updating unit configured to update control software installed on the simulator to new control software.

Further features of the present invention will become apparent from the following description of exemplary embodiments with reference to the attached drawings.

DESCRIPTION OF THE EMBODIMENTS

An exposure system which can update the control software installed on an exposure apparatus to new control software and a method of testing the updating, according to the present invention, will be described below.

First Embodiment

Figure 1:
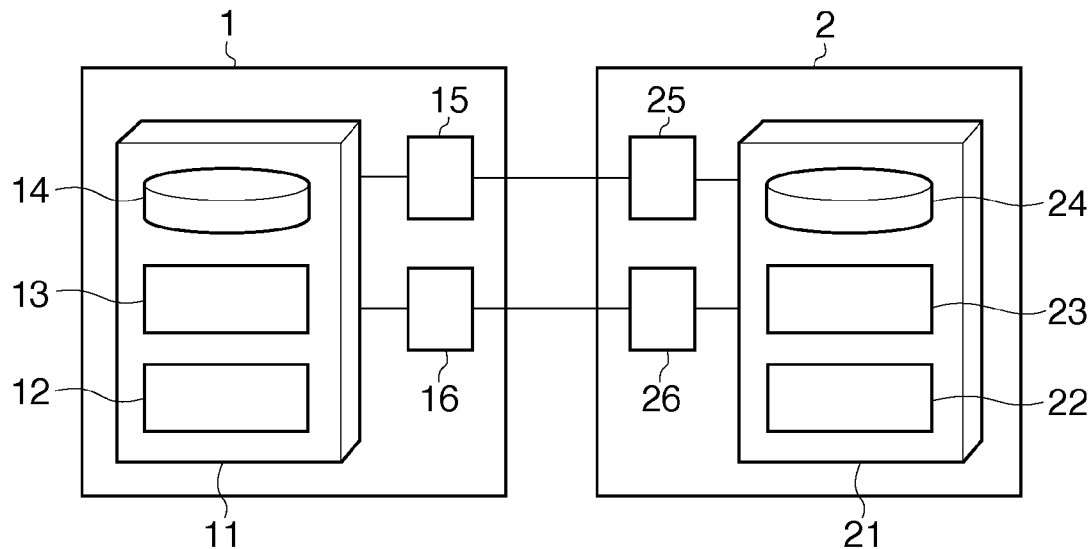
FIG. 1 is a schematic block diagram showing an exposure system according to the first embodiment.

FIG. 1 is a schematic block diagram showing an exposure system according to the first embodiment. The exposure system according to the first embodiment includes a test exposure apparatus 21 for testing control software used to update an exposure apparatus, separately from an exposure apparatus 11 that performs a normal exposure process. Another exposure apparatus different from an exposure apparatus having its control software to be updated can be used as the test exposure apparatus 21. Also, a simulator that tests the operation of an exposure apparatus can be used in place of another exposure apparatus in order to test control software used to update the exposure apparatus. To improve the test accuracy, the exposure system also includes an output unit 16 for outputting configuration information of the exposure apparatus 11, which includes information representing a temporal change of the exposure apparatus 11. The exposure system moreover includes a reflecting unit 26 for reflecting a temporal change of the exposure apparatus 11 on the configuration state of the test exposure apparatus 21 based on the configuration information of the exposure apparatus 11, which is output from the output unit 16.

Referring to FIG. 1, reference numeral 1 denotes the installation location of an exposure apparatus, such as a semiconductor device manufacturing plant. Reference numeral 2 denotes an exposure apparatus manufacturing company serving as a vendor facility that develops and manages exposure apparatuses.

The semiconductor device manufacturing plant 1 is equipped with at least one exposure apparatus 11. The exposure apparatus 11 includes an exposure unit 12 which exposes a substrate via the pattern of an original, a controller 13 which controls the exposure unit 12 by control software, and a data holding unit 14 which holds data including the control software. The data holding unit 14 is, for example, a known hard disk. The semiconductor device manufacturing plant 1 is also equipped with a second updating unit 15 which updates the control software installed on the exposure apparatus 11 to new control software. The second updating unit 15 updates the control software held in the data holding unit 14 to new control software which is determined using the test exposure apparatus 21 to operate normally. Examples of the details of updating by the second updating unit 15 are an operation for storing a copy of the control software in the data holding unit 14 and an operation for updating a database.

The semiconductor device manufacturing plant 1 is moreover equipped with the output unit 16 that outputs configuration information of the exposure apparatus 11. The output unit 16 outputs configuration information of the exposure apparatus 11 to the outside of the exposure apparatus 11. The configuration information of the exposure apparatus 11 includes pieces of information representing its hardware configuration, software configuration, and temporal change. Examples of the information pertaining to the hardware configuration included in the configuration information are the presence/absence of hardware options of the exposure apparatus 11 and the model number of hardware that constitutes the exposure apparatus 11. Examples of the information pertaining to the software configuration included in the configuration information are the name of software running on the exposure apparatus 11, the version name of the software, and the setting of software options. Examples of the information representing a temporal change of the exposure apparatus 11 are the optical performance of a projection optical system which projects an image of an original onto a substrate, the operating speed of a conveyance mechanism which conveys a substrate or an original, the expansion coefficient of a piezoelectric element which drives the projection optical system, and the amount of light emitted by a light source. The exposure apparatus detects the apparatus state to obtain information representing a temporal change of the exposure apparatus, and corrects the adverse influence that the temporal change exerts on the apparatus.

In contrast, the vendor facility 2 is equipped with one or more test exposure apparatuses 21. The test exposure apparatus 21 includes a test exposure unit 22 that exposes a substrate via the pattern of an original or simulates exposure. The test exposure apparatus 21 also includes a test controller 23 which controls the test exposure unit 22 by control software, and a test data holding unit 24 which holds data including the control software. A simulator that simulates a behavior equivalent to that of the exposure unit 12 of the exposure apparatus 11 can be used as the test exposure unit 22. The test controller 23 includes, for example, a user interface so that the operator of the test exposure apparatus 21 can operate it. That is, the test exposure apparatus 21 is an exposure apparatus equivalent to the exposure apparatus 11 or an apparatus which can simulate an operation equivalent to that of the exposure apparatus 11.

The vendor facility 2 is also equipped with an updating unit (first updating unit) 25 that updates the control software installed on the simulator to new control software. The first updating unit 25 updates the control software held in the test data holding unit 24. The first updating unit 25 updates the control software on the test exposure apparatus 21 by storing a copy of the control software in the test data holding unit 24 and updating the database of the test data holding unit 24. That is, the first updating unit 25 updates the control software on the test exposure apparatus 21 in the same way as in the updating of the control software on the exposure apparatus 11 by the second updating unit 15.

The vendor facility 2 is moreover equipped with the reflecting unit 26 that reflects a temporal change of the exposure apparatus 11 on the state of the test exposure apparatus 21. The reflecting unit 26 receives the configuration information of the exposure apparatus 11, which is output from the output unit 16, and updates the configuration of the test exposure apparatus 21 to be equivalent to that of the exposure apparatus 11.

The output unit 16 and reflecting unit 26 are connected via a communication network, and the second updating unit 15 and first updating unit 25 are connected via a communication network. The output unit 16 and reflecting unit 26 exchange the configuration information of the exposure apparatus 11 via the communication network. The configuration information of the exposure apparatus 11 may be exchanged via a medium such as a CD-ROM or a magnetooptical disk, instead of using a communication network.

The second updating unit 15, output unit 16, first updating unit 25, and reflecting unit 26 can be implemented by a known computer or board computer. A computer or board computer for implementing the second updating unit 15 may simultaneously serve as the output unit 16. Similarly, a computer or board computer for implementing the first updating unit 25 may simultaneously serve as the reflecting unit 26.

Although the vendor facility 2 is equipped with the test exposure apparatus 21, first updating unit 25, and reflecting unit 26, the present invention is not limited to this. The semiconductor device manufacturing plant 1, for example, may be equipped with the test exposure apparatus 21, first updating unit 25, and reflecting unit 26.

Figure 2:
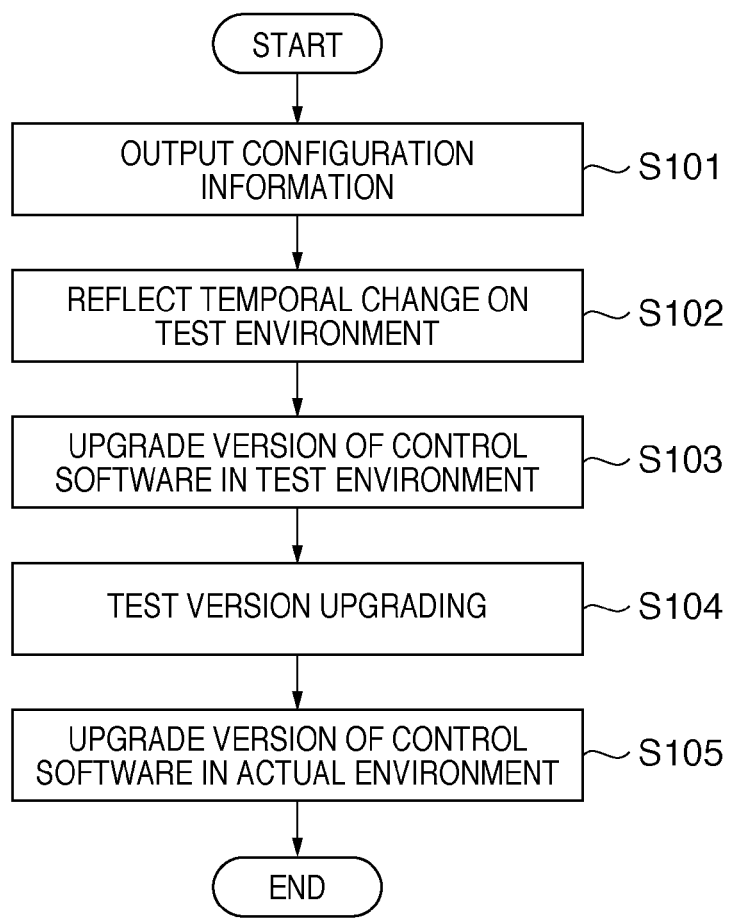
FIG. 2 is a flowchart showing a method of updating control software in the first embodiment.

A method of updating the control software on the exposure apparatus 11 to new control software and a method of testing the updating of the control software in this embodiment will be described next. The point of paramount importance in a series of processes is to test updating of the control software on the exposure apparatus 11 by the test exposure apparatus 21 by setting the configuration of the test exposure apparatus 21 to be equivalent to that of the exposure apparatus 11 or to an environment similar to it before the control software on the exposure apparatus 11 is updated. FIG. 2 is a flowchart showing the sequence of a process in which the output unit 16 outputs configuration information of the exposure apparatus 11, updating is tested, and the control software on the exposure apparatus 11 is updated to new control software.

In step S101 of FIG. 2, the output unit 16 outputs configuration information of the exposure apparatus 11. The configuration information of the exposure apparatus 11 includes, for example, pieces of information representing its hardware configuration, software configuration, and temporal change, as described above. A method of obtaining configuration information of the exposure apparatus 11 by the output unit 16 will be explained herein. One example of a method of obtaining the hardware configuration will be described first. At the time of the manufacture of the exposure apparatus 11, the presence/absence of hardware options of the exposure apparatus 11 and the model number of hardware that constitutes the exposure apparatus 11, for example, are described in the data holding unit 14 as information pertaining to the hardware configuration. Also, the above-mentioned information described in the data holding unit 14 is updated at the times of, for example, hardware replacement and repair. The output unit 16 outputs the information pertaining to the hardware configuration. One example of a method of obtaining the software configuration by the output unit 16 will be described next. At the time of updating of control software, the second updating unit 15 stores control software in the data holding unit 14 and also stores pieces of information such as the name and version of the control software. The output unit 16 outputs these pieces of information pertaining to the software configuration. The output unit 16 also outputs setting information on the software, such as the setting of software options in the exposure apparatus 11, by reading out it from the data holding unit 14.

One example of a method of obtaining, by the output unit 16, information representing a temporal change which differs among individual exposure apparatuses will be described lastly. A method of obtaining the arm driving speed when a substrate is loaded into the exposure apparatus 11, which exemplifies the information representing a temporal change, will be explained. The arm driving speed is measured based on, for example, the time from the start of substrate loading until the end of the loading. The measurement result is held in the data holding unit 14 as the configuration information. When a test such as throughput measurement in which the number of times of exposure within a predetermined period of time is counted is conducted, the test result varies depending on the arm driving speed. In other words, the fact that the apparatus state typified by the arm driving speed differs even among exposure apparatuses having both their sets of hardware and software set in the same environments as each other influences the updating test result. For this reason, the configuration information is used in the test. The measurement result is held in the data holding unit 14 as the configuration information. The output unit 16 outputs the arm driving speed. Note that the information representing a temporal change includes hardware adjustment values such as the hardware installation position.

In step S102, the configuration of the test exposure apparatus 21 is updated in accordance with the configuration information output from the output unit 16 first. The configuration information of the exposure apparatus includes pieces of information representing its hardware, software, and temporal change. A temporal change of the exposure apparatus 11 is reflected on the test environment of the test exposure apparatus 21 in step S102. In step S103, the first updating unit 25 updates the control software on the test exposure apparatus 21, having its configuration information updated, to control software used to update the exposure apparatus 11. A method of updating the control software on the test exposure apparatus 21 is the same as described in relation to the first updating unit 25. A method of updating the configuration of the test exposure apparatus 21 will be explained herein. One example of a method of updating the hardware configuration of the test exposure apparatus 21 will be described first. When a unit equivalent to the exposure unit 12 of the exposure apparatus 11 is used as the test exposure unit 22, the hardware configuration of the test exposure unit 22 is updated by, for example, hardware replacement. Also, the hardware is adjusted where necessary. When a simulator is used as the test exposure unit 22, the configuration setting of the simulator is changed to be equivalent to that of the exposure apparatus 11. The setting of the presence/absence of a hardware unit in the simulator is changed in accordance with, for example, information on the presence/absence of hardware options of the exposure apparatus as one configuration information. One example of a method of updating the software configuration of the test exposure apparatus 21 will be described next. The version of the control software on the test exposure apparatus 21 is updated to be the same as in the exposure apparatus before its control software is updated where necessary. Also, setting information on the software such as the setting of software options is also stored in the test data holding unit 24. One example of a method of updating the apparatus state representing a temporal change of the test exposure apparatus 21 will be described lastly. A wafer conveyance unit will be exemplified as one example of updating of the apparatus state representing a temporal change. The driving speed of the arm portion of the wafer conveyance unit is regulated in accordance with arm driving information as the configuration information. Alternatively, the arm portion of the wafer conveyance unit is replaced with one driven at nearly the same speed. As has been explained in these examples, the accuracy of control software updating can be improved by matching the configuration of the test exposure apparatus 21 with that of the exposure apparatus 11.

In step S104, the control software updating operation is tested using the test exposure apparatus 21 having its control software updated to new control software. Examples of the test of the updating operation are a regression test that determines whether an operation that has functioned before updating malfunctions after the updating, and a new item test that determines whether a function added upon updating works normally. If the test result is normal, the process advances to step S105. If the test result is abnormal, the process does not advance to step S105 but ends after a message indicating as such is displayed.

In step S105, the new control software installed on the test exposure apparatus 21 is installed on the exposure apparatus 11 using the second updating unit 15. That is, the second updating unit 15 updates the control software on the exposure apparatus 11 to new control software. An updating method is the same as described in relation to the second updating unit 15.

If only a control software test is conducted without updating the control software on the exposure apparatus 11, a test method that omits step S105 need only be used in the updating method described with reference to FIG. 2. In this case, the system shown in FIG. 1 does not require the second updating unit 15.

Figure 3:
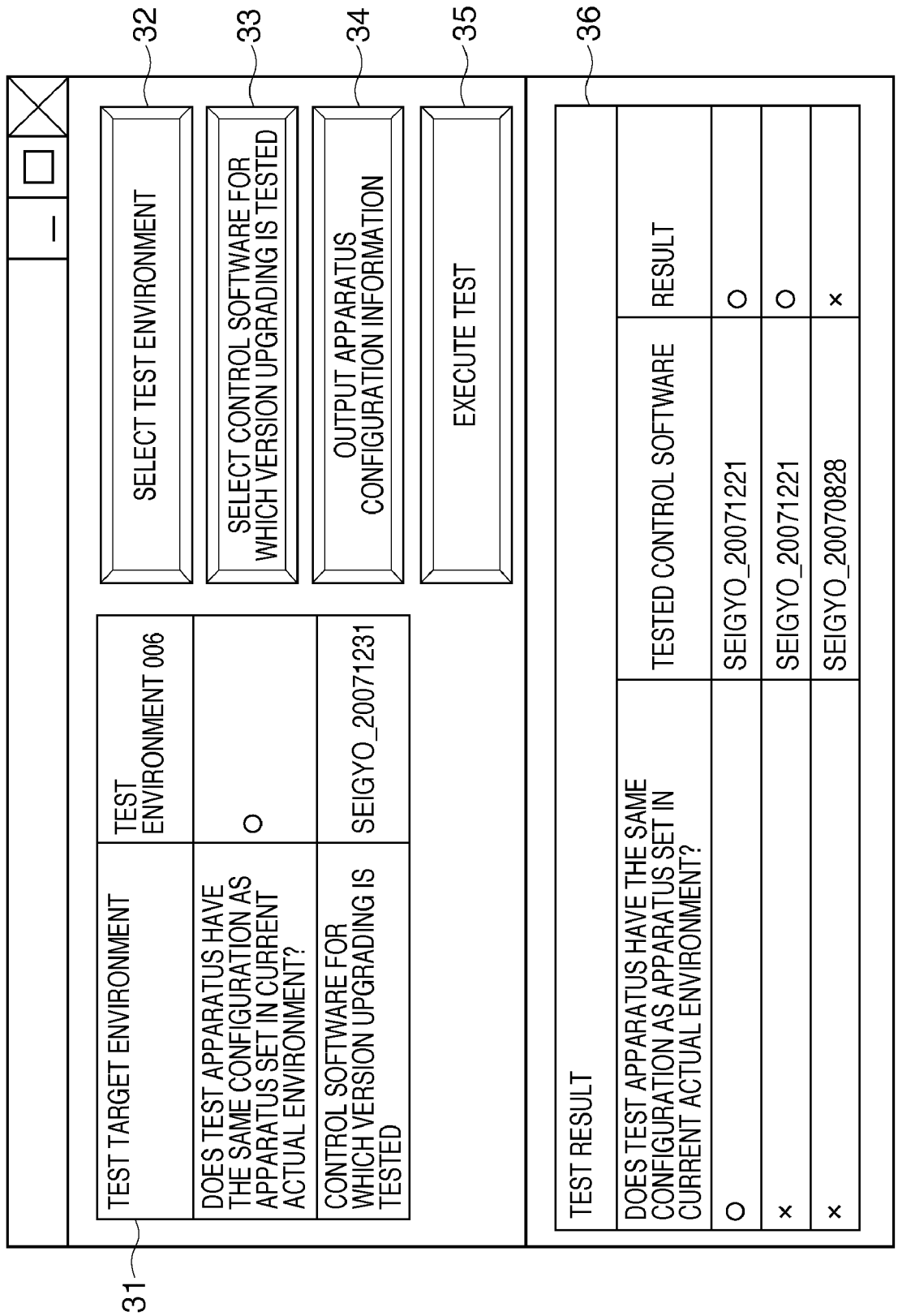
FIG. 3 is a view illustrating an example of a user interface window.

A user interface in the second updating unit 15 will be explained next. FIG. 3 shows a user interface window. Using this interface, the operator of the exposure apparatus 11 operates and checks the exposure apparatus 11 and test exposure apparatus 21. As operation buttons, the user interface window includes a test environment selection button 32, a control software selection button 33, a button 34 for outputting configuration information of the exposure apparatus 11, and a test execution button 35. This window also includes a test target environment confirmation window 31 to confirm the test target environment. The test exposure apparatus 21 to be tested can be selected by pressing the test environment selection button 32. Control software for which an updating operation is to be tested can be selected by pressing the control software selection button 33. The operator of the exposure apparatus 11 can confirm the names of the selected test exposure apparatus and control software via the test target environment confirmation window 31. Configuration information of the exposure apparatus 11 can be output by pressing the configuration information output button 34. An updating operation test can be executed based on the selected test environment and control software and the output configuration information by pressing the test execution button 35. The user interface window also includes a test result confirmation window 36 to confirm the test result. The test result confirmation window 36 displays the result of the executed updating operation test. The display contents are the determination result as to whether the configuration of the exposure apparatus 11 is equivalent to that of the test exposure apparatus 21, the name of the tested control software, and the test execution result. Although a user interface operated by the second updating unit 15 has been explained herein, the present invention is not limited to this. For example, operations that use this user interface may be performed in one of the exposure apparatus 11, test exposure apparatus 21, and first updating unit 25.

The first embodiment to which the present invention is applied has been described above. The system according to this embodiment includes the test exposure apparatus 21 for testing control software applied to the exposure apparatus 11 and its updating operation, separately from the exposure apparatus 11 that performs a normal exposure process. This system also includes the reflecting unit 26 that sets the configuration of the test exposure apparatus 21 to be equivalent to that of the exposure apparatus 11 for which an updating operation is performed. This makes it possible to further improve the efficiency of a preliminary test for updating the control software on an exposure apparatus.

Second Embodiment

Another example of an exposure system, a method of testing updating of control software, and a method of updating the control software on an exposure apparatus, to which the present invention is applied, will be described as the second embodiment. The exposure system according to this embodiment efficiently tests functions that are included in control software to be updated and are not upgraded when the control software is updated, in addition to the test method described in the first embodiment. In other words, this is called a regression test that tests functions that remain the same in operation before and after the control software is updated. Because such functions are those that are not upgraded when the control software is updated, they are expected to operate in the same manner under normal circumstances. However, this test is conducted in order to extract a phenomenon in which the operation changes upon upgrading another function. This phenomenon is more likely to occur as the relationships among a plurality of sets of software running on the exposure apparatus and those among the functions of one software become more complex. As the control software on an exposure apparatus becomes larger and more complex, the importance of a test of this phenomenon grows, as described in "Description of the Related Art". In view of this, the exposure system according to this embodiment collects records (to be referred to as logs hereinafter) of exposure operations by control software before and after updating, and compares these two logs.

Figure 4:
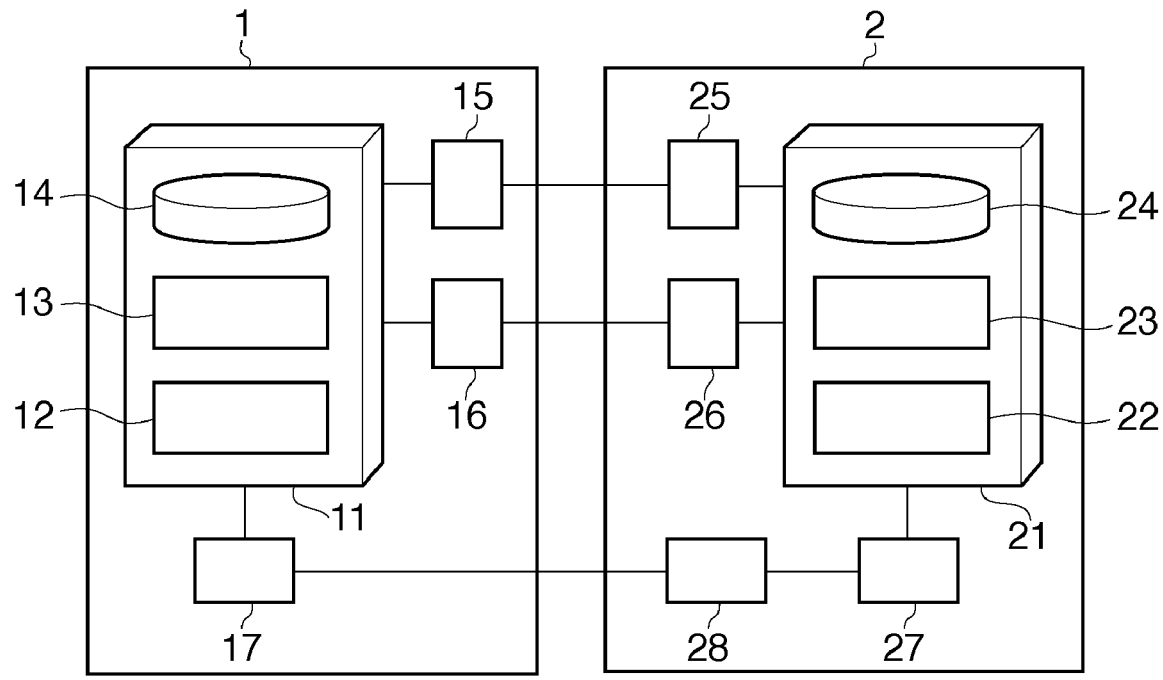
FIG. 4 is a schematic block diagram showing an exposure system according to the second embodiment.

FIG. 4 is a schematic block diagram showing the exposure system according to this embodiment. In FIG. 4, constituent components other than a second obtaining unit 17, first obtaining unit 27, and comparison unit 28 are the same as in the first embodiment described with reference to FIG. 1. For this reason, a description of an exposure apparatus 11, exposure unit 12, controller 13, data holding unit 14, second updating unit 15, and output unit 16 which are located in a semiconductor device manufacturing plant 1 in FIG. 4 will not be given. A description of a test exposure apparatus 21, test exposure unit 22, test controller 23, test data holding unit 24, first updating unit 25, and reflecting unit 26 which are located in a vendor facility 2 in FIG. 4 will not be given, either.

Figure 5:
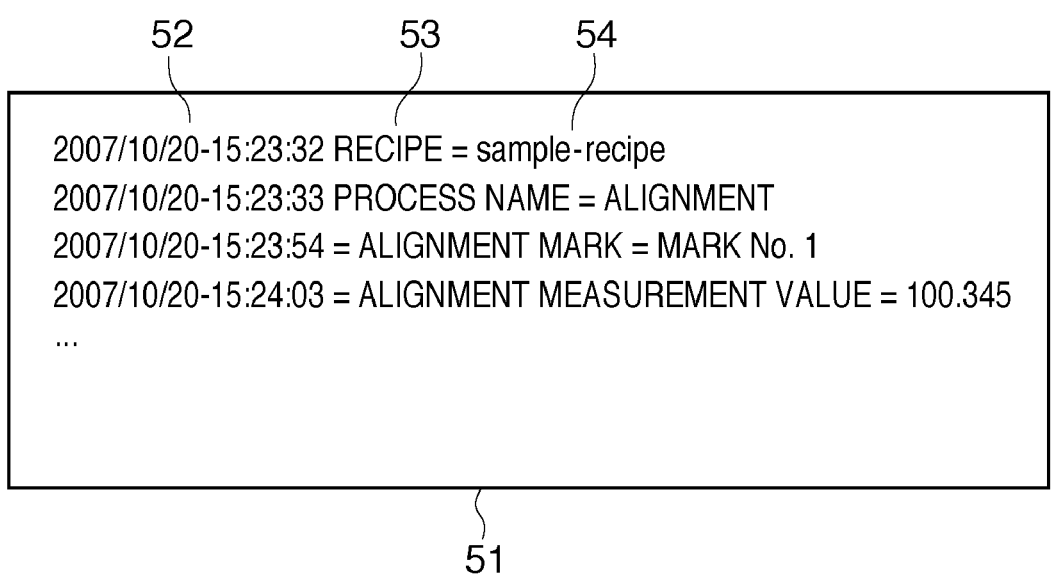
FIG. 5 is a table illustrating one example of a log.

The second obtaining unit 17 is connected to the exposure apparatus 11 and obtains a log of the exposure operation of the exposure apparatus 11 before its control software is updated to new control software. The first obtaining unit 27 is connected to the test exposure apparatus 21 and obtains a log of the exposure operation of the test exposure apparatus 21 after its control software is updated to new control software. The control software running on the two exposure apparatuses 11 and 21 has a function of saving information pertaining to an exposure operation in progress in the data holding unit 14 or test data holding unit 24 as a log. The second obtaining unit 17 and first obtaining unit 27 obtain the logs saved in the two exposure apparatuses 11 and 21 from the data holding unit 14 or test data holding unit 24. A log as a record of an exposure operation is obtained by saving, for example, the contents, parameters, and results of the exposure operation together with the operation record identifiers and the exposure operation times at a plurality of preset timings of a process executed by the control software. A log is saved as, for example, a computer file that describes these pieces of information as a text. FIG. 5 illustrates one example of the log. Each line of a log 51 corresponds to one operation record. Each operation record includes a processing time 52, operation record identifier 53, and recorded content 54.

The comparison unit 28 compares the log for the exposure apparatus 11 obtained by the second obtaining unit 17 with that for the test exposure apparatus 21 obtained by the first obtaining unit 27. When these logs each are, for example, a file which saves an operation record as a text, the comparison unit 28 compares the texts of the two files. However, note that these logs each include data, unnecessary for an operation comparison, such as the processing time and data unique to each exposure apparatus. For this reason, the comparison unit 28 has a function of presetting data not to be compared. The comparison unit 28 sets data not to be compared using, for example, its identifier. The result of a comparison between these two logs is displayed on a display unit such as a monitor (not shown). By this display, the user confirms whether the operation remains the same between two sets of control software before and after updating. That is, the comparison unit 28 confirms whether the test exposure apparatus 21 having its control software updated to new control software has performed an exposure operation which is determined in advance not to be influenced by the updating to new control software.

Known computers or board computers can implement the second obtaining unit 17, first obtaining unit 27, and comparison unit 28. The computers or board computers for implementing the second updating unit 15 and output unit 16 may simultaneously serve as the second obtaining unit 17. Similarly, the computers or board computers for implementing the first updating unit 25 and reflecting unit 26 may simultaneously serve as the first obtaining unit 27 and comparison unit 28.

Figure 6:
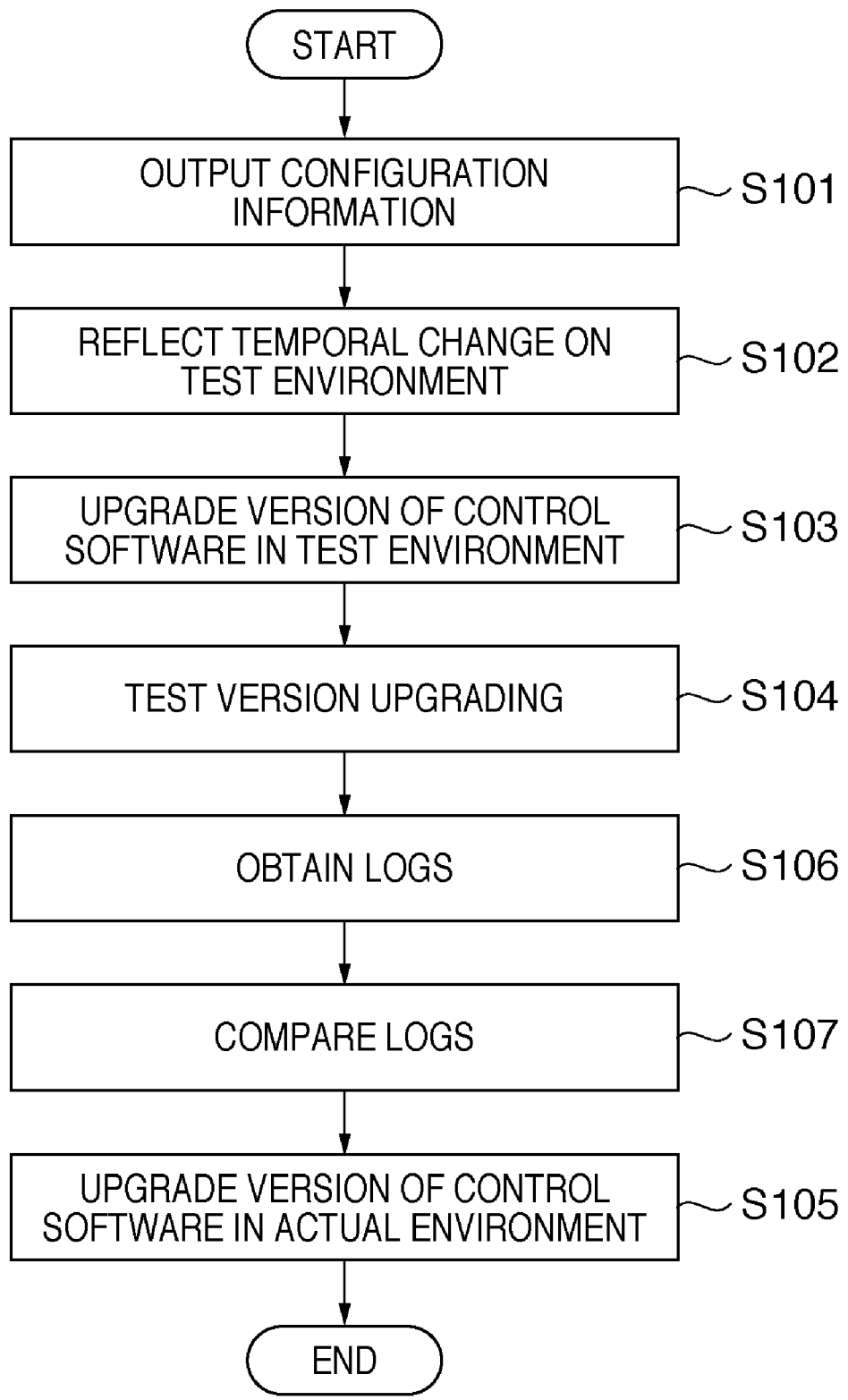
FIG. 6 is a flowchart showing a method of updating control software in the second embodiment.
Figure 7:
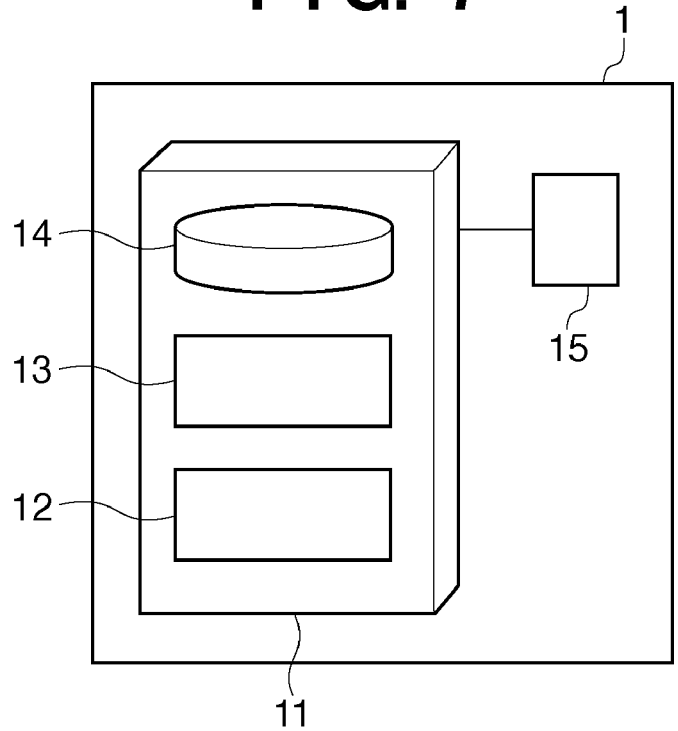
FIG. 7 is a schematic block diagram showing a conventional exposure system.
Figure 8:
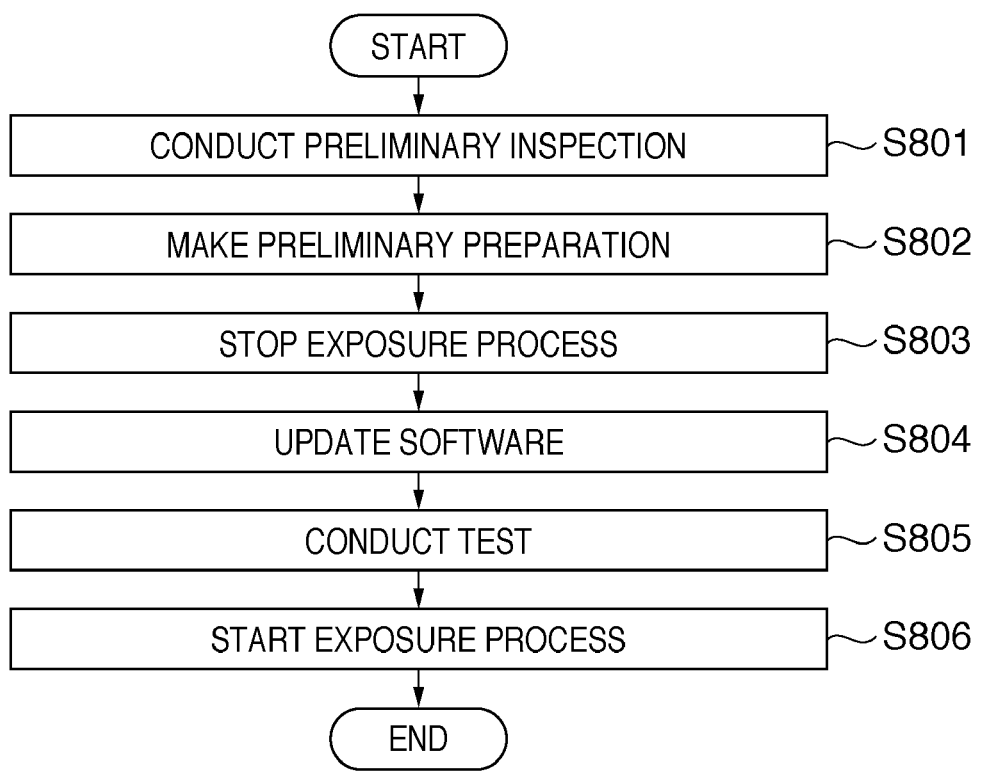
FIG. 8 is a flowchart showing a conventional method of updating control software.

A method of updating the control software on the exposure apparatus 11 and a method of testing the updating in this embodiment will be described next. FIG. 6 is a flowchart showing a method of updating the control software on the exposure apparatus 11 in this embodiment. In FIG. 6, processes other than those in steps S106 and S107 are the same as in the first embodiment described with reference to FIG. 2. For this reason, a description of steps S101, S102, S103, S104, and S105 in FIG. 6 will not be given.

Step S106 is a process of obtaining logs of exposure operations when an exposure apparatus performs the same operation before and after updating. More specifically, the exposure apparatus 11 before its control software is updated and the test exposure apparatus 21 after its control software is updated obtain logs of exposure operations. In other words, the second obtaining unit 17 obtains a log before updating from the exposure apparatus 11, and the first obtaining unit 27 obtains a log after updating from the test exposure apparatus 21. The log obtaining is done by collecting the log saved in the exposure apparatus 11 from the data holding unit 14. The log obtaining is also done by collecting the log saved in the test exposure apparatus 21 from the test data holding unit 24. The detailed log contents are the same as described in relation to the second obtaining unit 17 and first obtaining unit 27. In this embodiment, the processes in steps S101 and S102 are performed in advance in order to match the configurations of the exposure apparatus 11 and test exposure apparatus 21 except for their sets of control software. Moreover, the two exposure apparatuses 11 and 21 use identical files (to be also referred to as recipes hereinafter) for setting the exposure operation conditions in order to match the operations of the exposure apparatus 11 and test exposure apparatus 21. A recipe is generally implemented as a computer file, and the two exposure apparatuses 11 and 21 can hold an identical file by transferring it via, for example, the second updating unit 15 and first updating unit 25. Identical or equivalent substrates and originals are used in the operations of the exposure apparatus 11 and test exposure apparatus 21.

In step S107, it is tested whether functions that are not upgraded when the control software is updated cause no change in the exposure operation before and after the updating. More specifically, this test is conducted by comparing, by the comparison unit 28, the logs for the two exposure apparatuses 11 and 21 when they perform the same operation, which are obtained in step S105. A detailed method of comparing the logs is the same as described in relation to the comparison unit 28. If a change in operation attributed to the functions that are not upgraded when the control software is updated is detected in step S107, step S105 is canceled like step S105 in which an updating operation is tested. If only a control software updating operation test is conducted without updating the control software, a test method that omits step S105 need only be used in the updating method described with reference to FIG. 6.

The second embodiment to which the present invention is applied has been described above. This embodiment can efficiently test functions that are included in control software to be updated and are not upgraded when the control software is updated, in addition to the test method described in the first embodiment. This makes it possible to further improve the efficiency of a preliminary test for updating the control software on an exposure apparatus.

The present invention is applicable to an exposure system, a method of updating control software, and a method of testing the updating. More specifically, the present invention is applicable to an exposure apparatus that transfers by exposure the pattern of an original such as a mask or a reticle onto a substrate such as a semiconductor wafer or a glass substrate, and a system which conducts a preliminary test prior to updating of the control software on the exposure apparatus. The present invention is also applicable to a method of updating the control software on an exposure apparatus using the system, and a method of testing the updating operation.

[Method of Manufacturing Device]

A device is manufactured by an exposure step of exposing a substrate using the above-mentioned exposure apparatus, a development step of developing the substrate exposed in the exposure step, and subsequent known steps of processing the substrate developed in the development step. The subsequent known steps include, for example, etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-075142, filed Mar. 25, 2009, which is hereby incorporated by reference herein in its entirety.

What is claimed is:

1. An exposure system configured to update control software installed on an exposure apparatus to new control software, the system comprising:
    at least one exposure apparatus;
    a simulator configured to test an operation of said exposure apparatus;
    an output unit configured to output configuration information of said exposure apparatus, which includes information representing a temporal change of said exposure apparatus;
    a reflecting unit configured to reflect the temporal change of said exposure apparatus on said simulator based on the configuration information output from said output unit; and
    an updating unit configured to update control software installed on said simulator to new control software.

2. The system according to claim 1, wherein the information representing the temporal change includes at least one of an optical performance of a projection optical system, an expansion coefficient of a piezoelectric element which drives the projection optical system, an operating speed of a conveyance mechanism which conveys one of a substrate and an original, and an amount of light emitted by a light source, in said exposure apparatus.

3. The system according to claim 1, further comprising:
    a second updating unit configured to update control software installed on said exposure apparatus to the new control software determined using said simulator to operate normally.

4. The system according to claim 1, further comprising:
    a first obtaining unit configured to obtain a log of an exposure operation of said simulator having the control software updated to the new control software;
    a second obtaining unit configured to obtain a log of an exposure operation of said exposure apparatus before the control software thereof is updated to the new control software; and
    a comparison unit configured to compare the log obtained by said first obtaining unit with the log obtained by said second obtaining unit to confirm whether said simulator having the control software updated to the new control software has performed an exposure operation which is determined in advance not to be influenced by the updating to the new control software.

5. The system according to claim 4, wherein the logs obtained by said first obtaining unit and said second obtaining unit each include at least one of an exposure operation content, an exposure operation parameter, an exposure operation result, and an exposure operation time.

6. The system according to claim 4, wherein the exposure operation of said exposure apparatus and the exposure operation of said simulator are performed under identical conditions.

7. A method of testing updating of control software installed on an exposure apparatus to new control software, the method comprising:
    outputting configuration information of the exposure apparatus, which includes information representing a temporal change of the exposure apparatus;
    reflecting the temporal change of the exposure apparatus on a state of one of a simulator and a test exposure apparatus, which tests an operation of the exposure apparatus, based on the configuration information output in the outputting the configuration information;

updating control software installed on one of the simulator and the test exposure apparatus to new control software; and testing the updating to the new control software by exposure operations of one of the simulator and the test exposure apparatus, which has the control software updated to the new control software and on which the temporal change is reflected.

8. A method of manufacturing a device, the method comprising:

exposing a substrate using an exposure apparatus included in an exposure system;

developing the exposed substrate; and processing the developed substrate to manufacture the device, wherein the exposure system is configured to update control software installed on the exposure apparatus to new control software, and the exposure system comprises a simulator configured to test an operation of the exposure apparatus, an output unit configured to output configuration information of the exposure apparatus, which includes information representing a temporal change of the exposure apparatus, a reflecting unit configured to reflect the temporal change of the exposure apparatus on the simulator based on the configuration information output from the output unit, and an updating unit configured to update control software installed on the simulator to new control software.

* * * * *